(12) United States Patent
Zhan et al.

(10) Patent No.: US 7,332,964 B2
(45) Date of Patent: Feb. 19, 2008

(54) GAIN-STEP TRANSCONDUCTOR

(75) Inventors: Jing-Hong C Zhan, Hillsboro, OR (US); Stewart S. Taylor, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 73 days.

(21) Appl. No.: 11/471,095

(22) Filed: Jun. 20, 2006

(65) Prior Publication Data

US 2007/0290755 A1  Dec. 20, 2007

(51) Int. Cl.
*H03G 3/10* (2006.01)
(52) U.S. Cl. .......................................... 330/278; 330/51
(58) Field of Classification Search ................ 330/278, 330/51, 277, 254
See application file for complete search history.

(56) References Cited

U.S. PATENT DOCUMENTS

| | | | | |
|---|---|---|---|---|
| 2,981,835 A | * | 4/1961 | Nygaard et al. | ......... 455/250.1 |
| 3,622,210 A | * | 11/1971 | Thelen | ........................ 327/122 |
| 7,215,197 B2 | * | 5/2007 | Regier | ........................ 330/254 |

* cited by examiner

*Primary Examiner*—Henry Choe
(74) *Attorney, Agent, or Firm*—Dana B. LeMoine; LeMoine Patent Services, PLLC

(57) ABSTRACT

A gain-step transconductor circuit operates with multiple gain values. The gain can be stepped from one gain value to another by selecting a different signal path between an input node and an output amplifier. The output amplifier may operate as a common source amplifier or a common gate amplifier.

22 Claims, 5 Drawing Sheets

GAIN-STEP TRANSCONDUCTOR

FIELD

The present invention relates generally to amplifier circuits, and more specifically to amplifier circuits with variable gain.

BACKGROUND

Amplifiers typically receive an input signal and produce an output signal of larger amplitude. The ratio of the output amplitude to the input amplitude is referred to as "gain." Some amplifiers have variable gain. Variable gain in an amplifier can be achieved in many ways. Typically, there are tradeoffs that are made when designing a variable gain amplifier. For example, an amplifier may be designed to operate with a low noise figure, good input impedance match, and linearity at a particular gain setting. As the gain is varied, the noise figure, input impedance match, and linearity may change.

DESCRIPTION OF EMBODIMENTS

Figure 1:
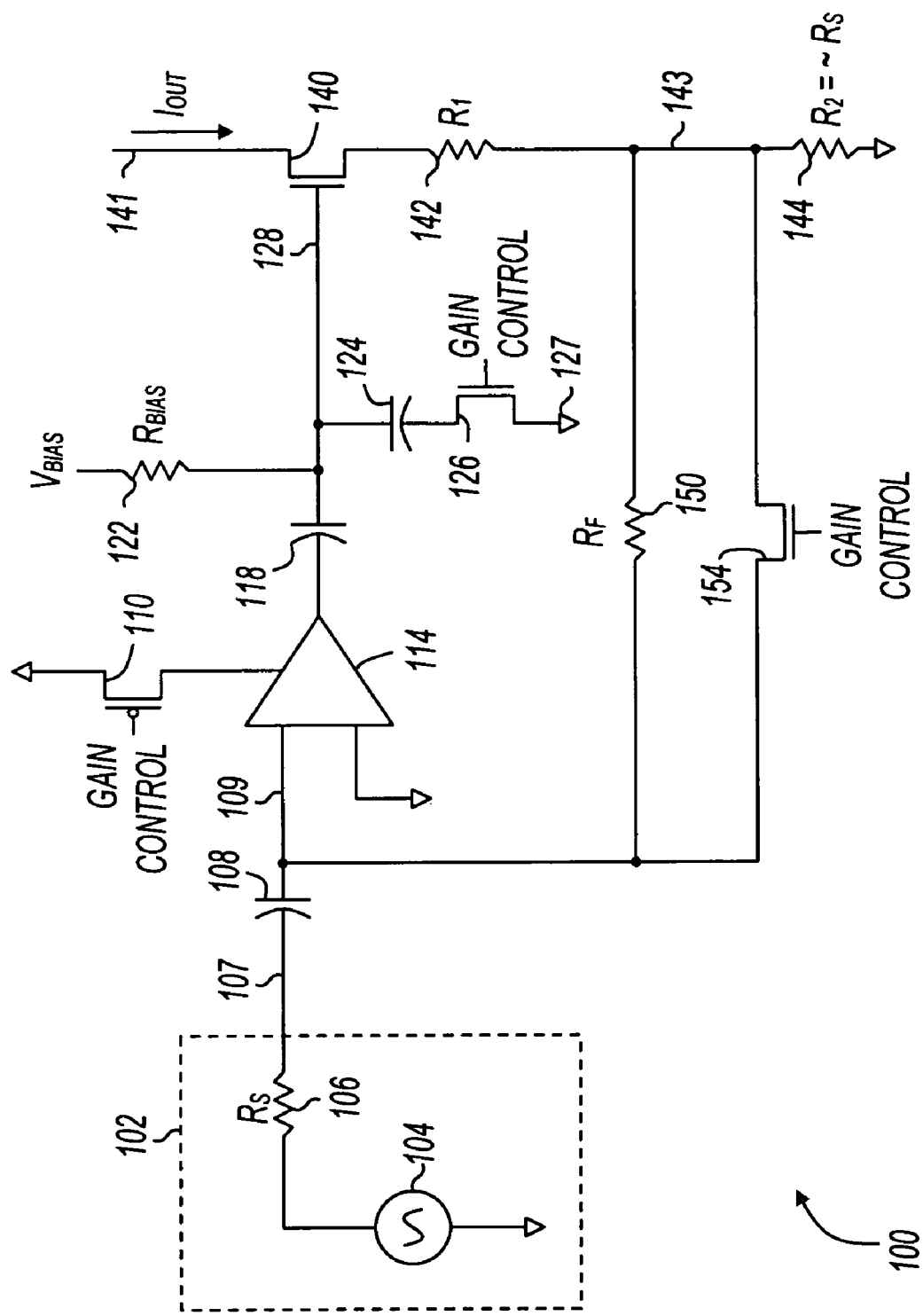
FIG. 1 shows a gain-step transconductor circuit in accordance with various embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a gain-step transconductor circuit in accordance with various embodiments of the present invention. Gain-step transconductor circuit 100 includes transistors 110, 126, 140, and 154, capacitors 108, 118, and 124, resistors 122 ($R_{BIAS}$), 142 ($R_1$), 144 ($R_2$), and 150 ($R_f$), and gain element 114. FIG. 1 also shows signal source 102. Signal source 102 is included in FIG. 1 to describe typical characteristics of a signal source that may be found driving gain-step transconductor circuit 100 in a system application. For example, resistor 106 ($R_S$) represents an output impedance of a signal source, and voltage source 104 represents a voltage signal provided by the same signal source. In various embodiments of the present invention, signal source 102 represents a signal source such as an antenna, an amplifier circuit, a digital-to-analog converter (DAC), or any other circuit capable of producing a varying voltage signal.

Gain-step transconductor circuit 100 is an amplifier that receives a voltage signal and produces a current signal. Gain-step transconductor circuit 100 receives a voltage from signal source 102 at node 107 and produces a current output signal ($I_{OUT}$) at node 141. The voltage received on node 107 is amplified according to various embodiments of the present invention to produce a current output signal. In some embodiments, gain-step transconductor circuit 100 is utilized in a voltage amplifier where the output current is drawn through a load impedance and the output is represented as a voltage signal. Various embodiments of voltage amplifiers incorporating gain-step transconductor circuit 100 are described with reference to later figures.

The circuit of FIG. 1 is referred to as a "gain-step" transconductor in part because the circuit can step through multiple gain modes. The example circuit shown in FIG. 1 can step through two modes of operation, referred to herein as the "low gain mode" and the "high gain mode." In each gain mode, a different signal path is selected between input node 107 and output transistor 140. Further, output transistor 140 operates as a common source amplifier or a common gate amplifier depending on the gain mode being utilized. The multiple gain modes of gain-step transconductor circuit 100 provide different amounts of gain while maintaining reasonable linearity and a substantially constant input impedance.

Gain-step transconductor circuit 100 steps the gain from one value to another in response to the value of the GAIN CONTROL signal. For example, when the GAIN CONTROL signal is set to a low voltage, gain-step transconductor circuit 100 operates in a high gain mode. When the GAIN CONTROL signal is set to a high voltage, gain-step transconductor circuit 100 operates in a low gain mode.

When the GAIN CONTROL signal is low, the input signal is amplified by gain element 114, and the output of gain element 114 is further amplified by output transistor 140 operating as a common source transistor amplifier. In this mode, transistor 110 is turned on, providing power to gain element 114. Further, transistor 126 is turned off, isolating node 128 from ground, and transistor 154 is off. The selected signal path in the high gain mode includes node 109, gain element 114, capacitor 118, and the gate of transistor 140. In the high gain mode, the signal is delivered to the gate of transistor 140 and the output is taken from the drain. In this mode, transistor 140 operates as a common source amplifier. $V_{BIAS}$ and $R_{BIAS}$ form a direct current (DC) bias circuit to bias the gate of transistor 140.

In the high gain mode, the transconductance ($G_m$) is given by $$G_m \cong \frac{R_f}{R_s(R_1 + R_2)} \quad (1)$$

and the input impedance is given by $$Z_{in} \cong \frac{R_f}{A_v} \cong R_s \quad (2)$$

where $A_v$ is the gain of gain element 114. Values for $A_v$ and $R_f$ may be chosen to provide a desired amount of gain and input impedance. For example, in one embodiment, $A_v$ may be 20, and $R_f$ may be 1000, for an input impedance of substantially 50 Ohms.

When the GAIN CONTROL signal is high, transistor 110 is off, removing power (or bias voltage) from gain element 114, effectively blocking the signal path through gain element 114. Gain element 114 may be "turned off" using circuit elements other than those shown in FIG. 1. For example, rather than removing power from gain element 114, the signal path may be interrupted using a transistor switch in series with either the input or output of gain element 114.

Also when the GAIN CONTROL signal is high, transistor 126 is on, operating as a switch to provide an alternating current (AC) signal path between the gate of transistor 140 and the reference node shown at 127. This reference node may or may not be at a "ground" potential. Node 128 remains biased by $V_{BIAS}$ and $R_{BIAS}$. In addition, transistor 154 is turned on, operating as a pass transistor to provide a signal path from node 109 to node 143.

The selected signal path in the low gain mode is from node 109 through transistor 154 to node 143. As shown in FIG. 1, $R_f$ is still in the circuit, but it may have an impedance much larger than transistor 154 and therefore may have little electrical effect. For example, if $R_f$ is 1000 Ohms and the "on" resistance of transistor 154 is on the order of 10 Ohms, then $R_f$ has little electrical effect. In some embodiments, a transistor switch may be coupled in series with $R_f$ to remove $R_f$ as a possible signal path for the low gain mode. In the low gain mode, the input signal is delivered to the source of transistor 140 through $R_1$ and the output signal is taken from the drain, and transistor 140 operates as a common gate amplifier.

The input signal is routed to the junction of a voltage divider formed by $R_2$ and $R_1$. $R_2$ may be chosen to be close in value to $R_S$ to provide input impedance matching, while $R_1$ may be chosen to set the transconductance. In the low gain mode, the transconductance of gain-step transconductor circuit 100 is given by:

$$G_m \cong \frac{1}{R_1} \quad (3)$$

and the input impedance is given by $$Z_{in} \cong R_2 \cong R_S \quad (4)$$

In the low gain mode, the signal travels through transistor 154 having a relatively low impedance, and is terminated by $R_2$ in parallel with the series combination of $R_1$ and the source impedance of transistor 140. In some embodiments, $R_1$ is chosen to be much larger than $R_2$, and the input impedance value is dominated by the impedance of $R_2$. All of the transistors may be chosen sufficiently large to be very linear when on, but not so large so as to have excess parasitic capacitance. $R_1$ may chosen to be relatively large (~500 Ohms), and the linearity in the low gain mode may be very good.

Using circuit values provided as examples above, the gain step may be 25-30 dB. In some embodiments, the magnitude of this gain step is reduced or made variable by introducing variable gain in gain element 114 and/or variable resistors $R_f$ and $R_1$. Variable resistors may be implemented by shunting the resistors shown with series combinations of additional resistors and switches.

As described above, gain-step transconductor circuit 100 includes two selectable signal paths for the input signal to reach transistor 140. In one gain mode, a first signal path is selected and transistor 140 operates as a common source amplifier. In another gain mode, another path is chosen, and transistor 140 operates as a common gate amplifier. The various embodiments of the present invention are not limited to two gain modes. As described further with reference to FIG. 3, some embodiments include three or more selectable signal paths and three or more gain modes.

Figure 2:
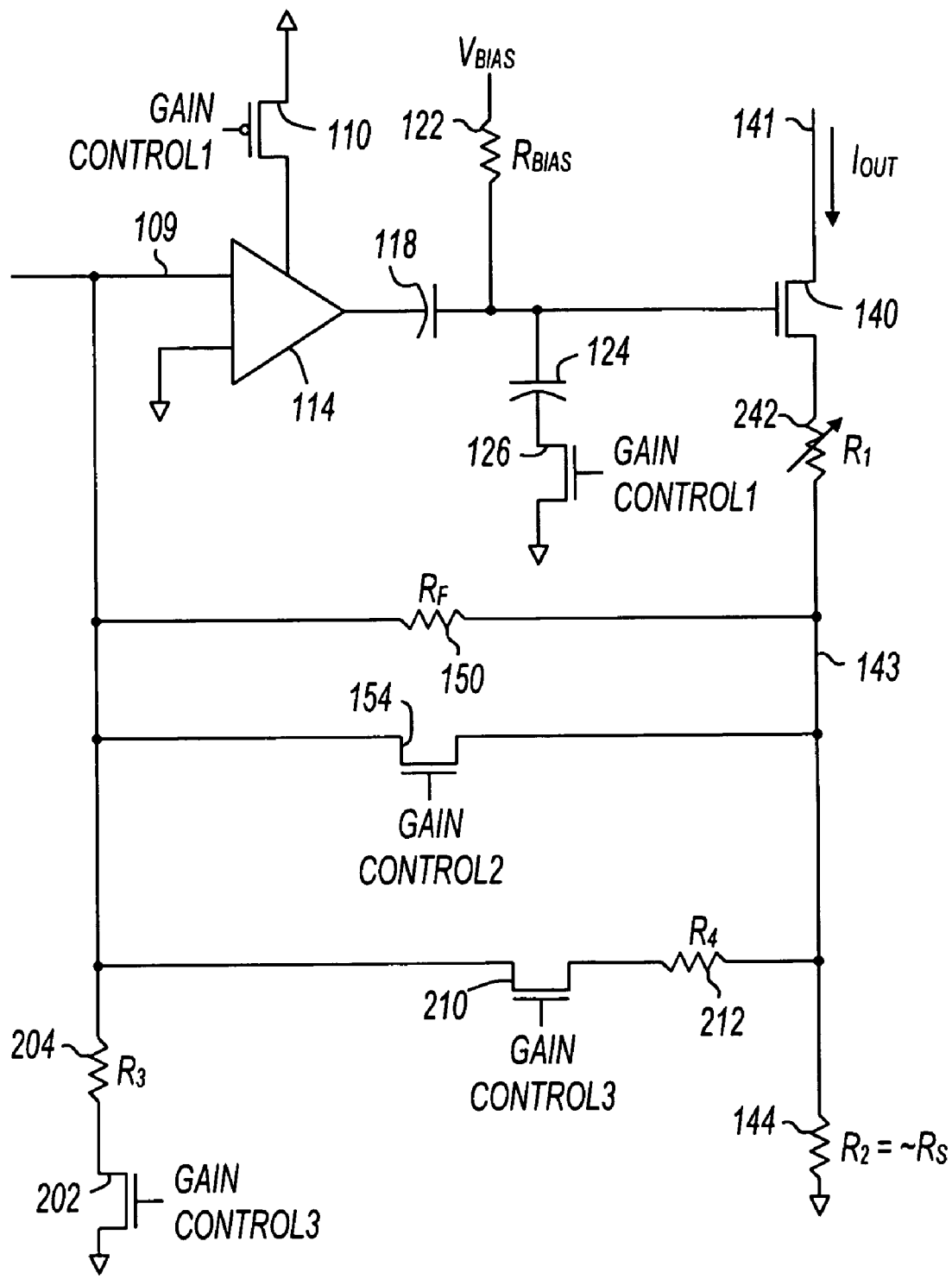
FIG. 2 shows a gain-step transconductor circuit in accordance with various embodiments of the present invention.

FIG. 2 shows a gain-step transconductor circuit in accordance with various embodiments of the present invention. Gain-step transconductor circuit 200 includes the same circuitry as gain-step transconductor 100 (FIG. 1), and also includes a third selectable signal path to provide a third gain mode. The gain control signals are changed slightly to control the three modes. When GAIN CONTROL1 is asserted low, and both GAIN CONTROL2 and GAIN CONTROL3 are de-asserted low, a high gain signal path through gain element 114 is selected. When GAIN CONTROL2 is asserted, and GAIN CONTROL1 and GAIN CONTROL3 are de-asserted, the low gain path through transistor 154 is selected. These two gain modes are substantially the same as those described above with reference to FIG. 1.

A third selectable signal path is provided through transistor 210 and resistor 212 ($R_4$). This signal path is selected when GAIN CONTROL3 is asserted and GAIN CONTROL1 and GAIN CONTROL2 are de-asserted. In embodiments represented by FIG. 2, $R_1$ is a variable resistor that may be reduced in value when the third signal path is selected. This variable resistance may be achieved by shunting the original resistor with another resistor controlled by a series switch. When the third gain mode is selected, transistor 140 operates as a common gate amplifier.

By carefully choosing values for resistors and transistor sizes (having non-zero resistance), the input impedance may be maintained close to $R_S$ while achieving a transconductance in between the high gain and low gain values described in FIG. 1. In some embodiments, additional resistors and switches are incorporated for additional gain settings. In general, any number of selectable signal paths may be added without departing from the scope of the present invention.

The transistors shown in FIGS. 1 and 2 are shown as field effect transistors, and specifically as metal oxide semiconductor field effect transistors (MOSFETs). Transistor 110 is shown as a P-type MOSFET, and the remaining transistors are shown as N-type MOSFETs. Other types of switching or amplifying elements may be utilized for the various transistors of circuits 100 or 200 without departing from the scope of the present invention. For example, the transistors of circuits 100 and 200 may be P-type MOSFETs, junction field effect transistors (JFETs), metal semiconductor field effect transistors (MESFETs), or any device capable of performing as described herein.

Figure 3:
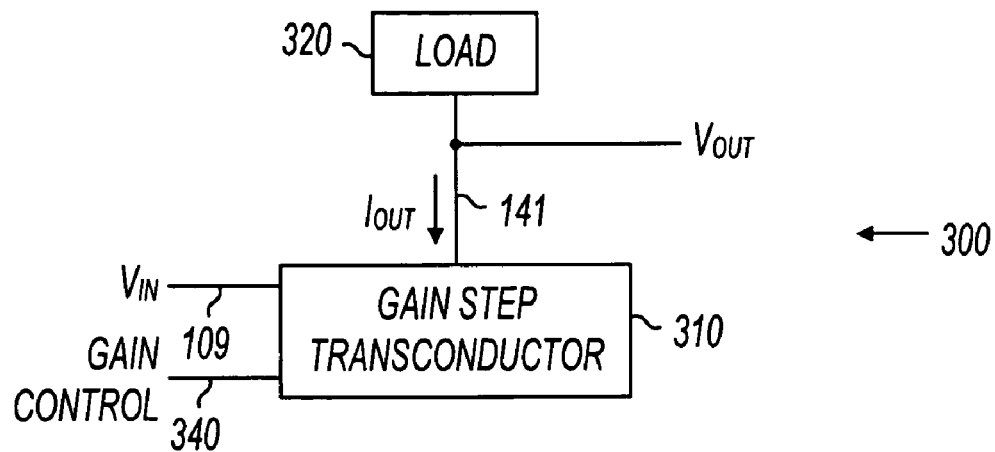
FIG. 3 shows an amplifier circuit in accordance with various embodiments of the present invention.

FIG. 3 shows an amplifier circuit in accordance with various embodiments of the present invention. Amplifier circuit 300 includes gain-step transconductor 310 and load 320. Gain-step transconductor 310 may include any gain-step transconductor embodiments described herein. For example, gain-step transconductor 310 may include gain-step transconductor 100 (FIG. 1) or 200 (FIG. 2). Load 320 may be any type of device that produces an output voltage in response to $I_{OUT}$. For example, load 320 may be a resistor or an active load device. Assuming all of $I_{OUT}$ passes through load 320, $V_{OUT}$ is equal to the product of $I_{OUT}$ and the impedance of load 320.

Gain-step transconductor 310 receives input voltage $V_{IN}$ on node 109, and also receives gain control signals on node(s) 340. The gain control signals on node 340 may control selectable signal paths within gain-step transconductor 310 to select gain modes. Further, the gain control signals may also modify variable resistors or gain elements to modify the gain in selected signal paths.

Figure 4:
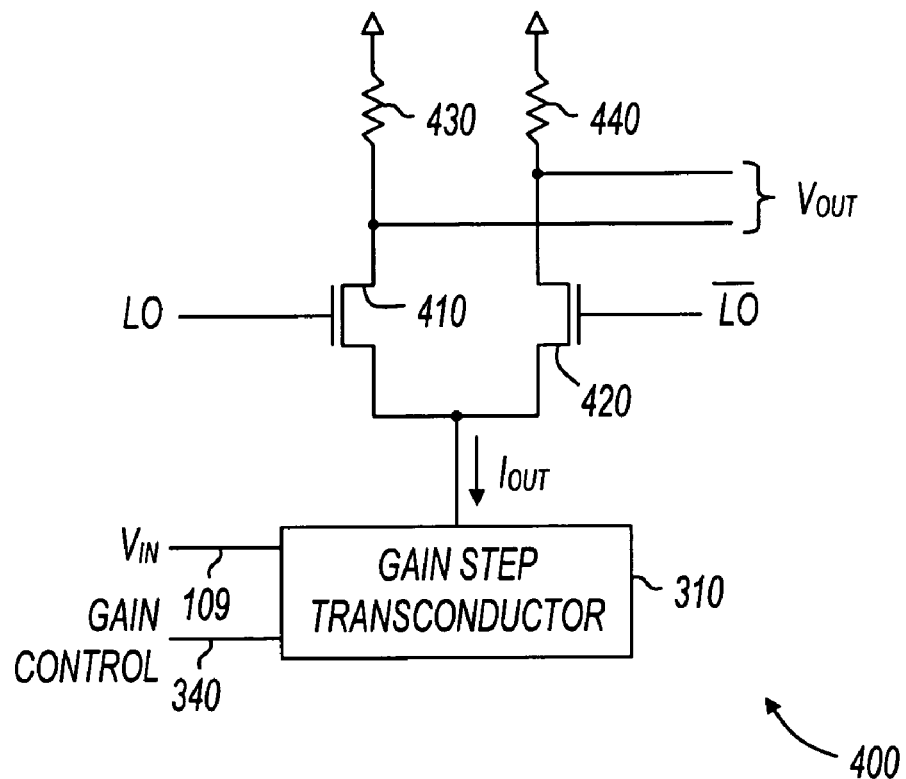
FIG. 4 shows a mixer circuit in accordance with various embodiments of the present invention.

FIG. 4 shows a mixer circuit in accordance with various embodiments of the present invention. Mixer circuit 400 includes gain-step transconductor 310, differential pair of transistors 410 and 420, and resistors 430 and 440. Gain-step transconductor 310 is described above with reference to FIG. 3. Differential pair of transistors 410 and 420 receives a differential local oscillator (LO) signal. Gain-step transconductor 310 and the differential pair of transistors operate to mix the $V_{IN}$ signal with the LO, and produce an output signal $V_{OUT}$ having a frequency substantially equal to the difference of the frequencies of $V_{IN}$ and LO.

In some embodiments, mixer circuit 400 may be utilized in the front-end of a communications device. For example, $V_{IN}$ may be provided by an antenna or may be a filtered radio frequency (RF) signal. Also for example, mixer 400 may perform low noise amplification (LNA) while performing a frequency conversion.

Figure 5:
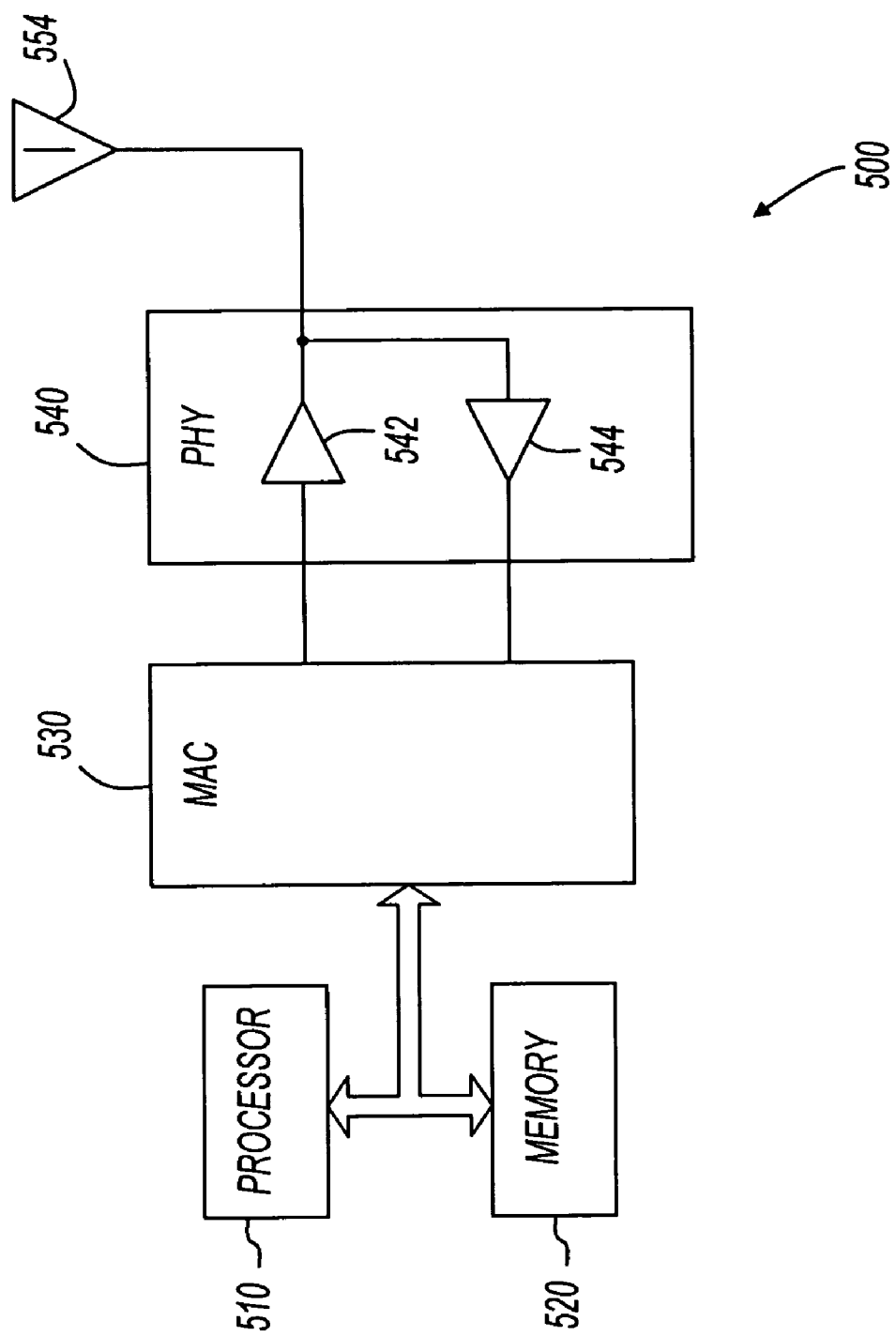
FIG. 5 shows a diagram of an electronic system in accordance with various embodiments of the present invention.

FIG. 5 shows a system diagram in accordance with various embodiments of the present invention. Electronic system 500 includes antenna 554, physical layer (PHY) 540, media access control (MAC) layer 530, processor 510, and memory 520. In operation, system 500 sends and receives signals using antenna 554, and the signals are processed by the various elements shown in FIG. 5.

Antenna 554 may include one or more antennas. For example, antenna 554 may include a single directional antenna or an omni-directional antenna. As used herein, the term omni-directional antenna refers to any antenna having a substantially uniform pattern in at least one plane. For example, in some embodiments, antenna 554 may include a single omni-directional antenna such as a dipole antenna, or a quarter wave antenna. Also for example, in some embodiments, antenna 554 may include a single directional antenna such as a parabolic dish antenna or a Yagi antenna. In still further embodiments, antenna 554 may include multiple physical antennas. For example, in some embodiments, multiple antennas are utilized for multiple-input-multiple-output (MIMO) processing or spatial-division multiple access (SDMA) processing.

Physical layer (PHY) 540 is coupled to antenna 554 to interact with other wireless devices. PHY 540 may include circuitry to support the transmission and reception of radio frequency (RF) signals. For example, as shown in FIG. 5, PHY 540 includes power amplifier (PA) 542 and low noise amplifier (LNA) 544. Power amplifier 542 may include a gain-step transconductor circuit such as those described above with reference to FIGS. 1-4. In some embodiments, PHY 540 includes additional functional blocks to perform filtering, frequency conversion or the like. PHY 540 may be adapted to transmit/receive and modulate/demodulate signals of various formats and at various frequencies. For example, PHY 540 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Example systems represented by FIG. 5 include cellular phones, personal digital assistants, wireless local area network interfaces, wireless wide area network stations and subscriber units, and the like. Many other systems uses for gain-step transconductor circuits exist. For example, PA 542 may be used in a desktop computer, a network bridge or router, or any other system without an antenna.

Media access control (MAC) layer 530 may be any suitable media access control layer implementation. For example, MAC 530 may be implemented in software, or hardware or any combination thereof. In some embodiments, a portion of MAC 530 may be implemented in hardware, and a portion may be implemented in software that is executed by processor 510. Further, MAC 530 may include a processor separate from processor 510.

Processor 510 may be any type of processor capable of communicating with memory 520, MAC 530, and other functional blocks (not shown). For example, processor 510 may be a microprocessor, digital signal processor (DSP), microcontroller, or the like.

Memory 520 represents an article that includes a machine readable medium. For example, memory 520 represents a random access memory (RAM), dynamic random access memory (DRAM), static random access memory (SRAM), read only memory (ROM), flash memory, or any other type of article that includes a medium readable by processor 510. Memory 520 may store instructions for performing software driven tasks. Memory 520 may also store data associated with the operation of system 500.

Although the various elements of system 500 are shown separate in FIG. 5, embodiments exist that combine the circuitry of processor 510, memory 520, MAC 530, and all or a portion of PHY 540 in a single integrated circuit. For example, MAC 530 and PA 542 may be combined together on an integrated circuit die. In some embodiments, the various elements of system 500 may be separately packaged and mounted on a common circuit board. In other embodiments, the various elements are separate integrated circuit dice packaged together, such as in a multi-chip module, and in still further embodiments, various elements are on the same integrated circuit die.

Gain-step transconductor circuits, amplifier circuits, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of gain-step transconductor circuit 100 (FIG. 1) may be represented as polygons assigned to layers of an integrated circuit.

Figure 6:
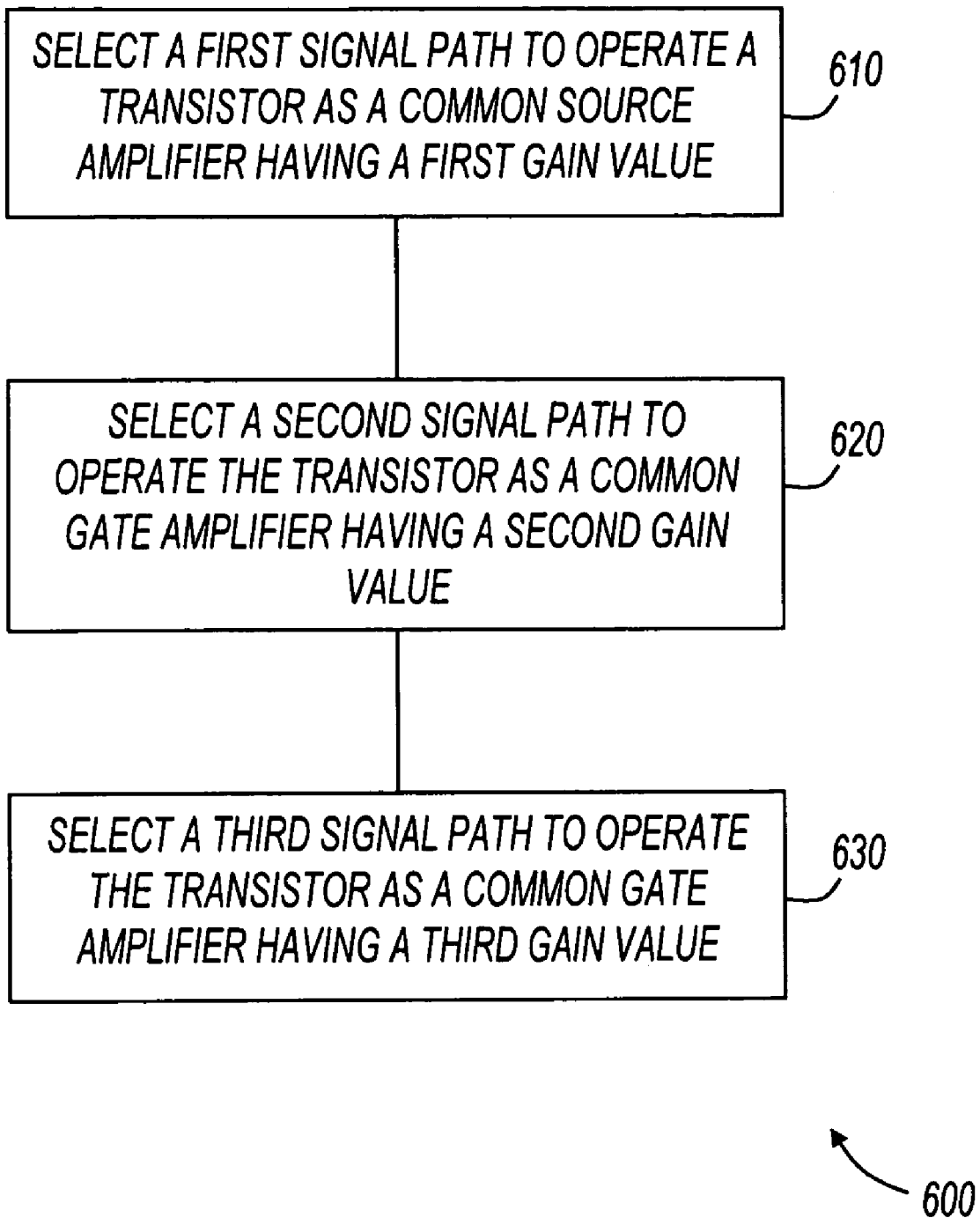
FIG. 6 shows a flowchart in accordance with various embodiments of the present invention.

FIG. 6 shows a flowchart in accordance with various embodiments of the present invention. In some embodiments, method 600, or portions thereof, is performed by a gain-step transconductor circuit or an amplifier circuit, embodiments of which are shown in previous figures. In other embodiments, method 600 is performed by an integrated circuit or an electronic system. Method 600 is not limited by the particular type of apparatus performing the method. The various actions in method 600 may be performed in the order presented, or may be performed in a different order. Further, in some embodiments, some actions listed in FIG. 6 are omitted from method 600.

Method 600 is shown beginning with block 610 in which a first signal path is selected to operate a transistor as a common source amplifier having a first gain value. For example, a gain element such as gain element 114 (FIGS. 1, 2) may be enabled to drive the gate of a transistor such as transistor 140 (FIGS. 1, 2). The first gain value may be modified by modifying the gain value of the gain element, modifying resistor values or both.

At 620, a second signal path is selected to operate the transistor as a common gate amplifier having a second gain value. In some embodiments, this may correspond to disabling the gain element referred to in 610 and enabling a different transistor such as transistor 154 (FIGS. 1, 2). In addition, the actions of 620 may correspond to selecting a signal path that couples the input signal to a voltage divider coupled to a source node of the transistor. For example, when transistor 154 is on, the input signal is routed to a junction between $R_1$ and $R_2$ (FIGS. 1, 2).

At 630, a third signal path is selected to operate the transistor as a common gate amplifier having a third gain value. A third selectable signal path may be as shown in FIG. 2. In some embodiments, more than three selectable signal paths exist, and method 600 continues with selecting more than three signal paths. Further, in some embodiments, the gain values may be modified by modifying resistor values or gain elements in a gain-step transconductor circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An amplifier circuit comprising:
an input node and an output node;
an output transistor having a drain coupled to the output node; and
first and second selectable signal paths from the input node to the output transistor, wherein the output transistor is coupled as a common source amplifier when the first selectable signal path is selected, and the output transistor is coupled as a common gate amplifier when the second selectable signal path is selected.

2. The amplifier circuit of claim 1 further comprising a voltage divider coupled between a source of the output transistor and a reference node, and wherein the second selectable signal path is coupled to the voltage divider.

3. The amplifier circuit of claim 2 wherein the second selectable signal path includes a pass transistor coupled to conditionally couple the input node to the voltage divider.

4. The amplifier circuit of claim 2 wherein the amplifier circuit exhibits a first input impedance when the first selectable signal path is selected and exhibits a second input impedance when the second selectable signal path is selected, wherein the first and second impedances are substantially equal.

5. The amplifier circuit of claim 4 wherein the first and second impedances are substantially equal to a resistance value of a resistor in the voltage divider.

6. The amplifier circuit of claim 1 wherein the first path includes a gain element coupled between the input node and a gate of the output transistor.

7. The amplifier circuit of claim 6 wherein power to the gain element can be interrupted.

8. The amplifier circuit of claim 7 further comprising a DC bias circuit coupled to the gate of the output transistor.

9. The amplifier circuit of claim 8 further comprising a capacitor and a switch coupled to conditionally provide a low AC impedance path between a reference node and the gate of the output transistor.

10. The amplifier circuit of claim 1 further comprising a third selectable signal path from the input node to the output transistor.

11. A method comprising:
selecting a first signal path to operate a transistor as a common source amplifier having a first gain value; and
selecting a second signal path to operate the transistor as a common gate amplifier having a second gain value.

12. The method of claim 11 wherein the first gain value is larger than the second gain value.

13. The method of claim 11 wherein selecting a first signal path comprises routing an input signal through a gain element coupled to a gate node of the transistor.

14. The method of claim 11 wherein selecting a second signal path comprises coupling an input signal to a voltage divider circuit coupled to a source node of the transistor.

15. The method of claim 11 further comprising selecting a third signal path to operate the transistor as a common gate amplifier having a third gain value.

16. The method of claim 15 wherein the third gain value is lower than the second gain value, and the second gain value is lower than the first gain value.

17. An electronic system comprising:
an antenna; and
an amplifier circuit coupled to receive signals from the antenna, the amplifier circuit comprising an input node and an output node, an output transistor having a drain coupled to the output node, and first and second selectable signal paths from the input node to the output transistor, wherein the output transistor is coupled as a common source amplifier when the first selectable signal path is selected, and the output transistor is coupled as a common gate amplifier when the second selectable signal path is selected.

18. The electronic system of claim 17 further comprising a voltage divider coupled between a source of the output transistor and a reference node, and wherein the second selectable signal path is coupled to the voltage divider.

19. The electronic system of claim 18 wherein the second selectable signal path includes a pass transistor coupled to conditionally couple the input node to the voltage divider.

20. The electronic system of claim 17 wherein the first path includes a gain element coupled between the input node and a gate of the output transistor.

21. The electronic system of claim 20 wherein power to the gain element can be interrupted.

22. The electronic system of claim 17 further comprising a third selectable signal path from the input node to the output transistor.

* * * * *